United States Patent
Chan et al.

(10) Patent No.: US 6,929,976 B2
(45) Date of Patent: Aug. 16, 2005

(54) MULTI-DIE MODULE AND METHOD THEREOF

(75) Inventors: Vincent Chan, Richmond Hill (CA); Samuel Ho, Toronto (CA)

(73) Assignee: ATI Technologies, Inc., Thornhill (CA)

( * ) Notice: Subject to any disclaimer, the term of this patent is extended or adjusted under 35 U.S.C. 154(b) by 0 days.

(21) Appl. No.: 10/616,342

(22) Filed: Jul. 9, 2003

(65) Prior Publication Data

US 2004/0106230 A1 Jun. 3, 2004

Related U.S. Application Data

(62) Division of application No. 09/886,741, filed on Jun. 21, 2001.

(51) Int. Cl.[7] .......................... H01L 21/44; H01L 21/48; H01L 21/50
(52) U.S. Cl. ......................................... 438/106; 438/107
(58) Field of Search ................................. 438/106, 107

(56) References Cited

U.S. PATENT DOCUMENTS

| | | | | |
|---|---|---|---|---|
| 5,471,366 A | * | 11/1995 | Ozawa | 361/704 |
| 5,784,264 A | * | 7/1998 | Tanioka | 361/803 |
| 5,872,051 A | * | 2/1999 | Fallon et al. | 438/616 |
| 6,069,023 A | * | 5/2000 | Bernier et al. | 438/107 |
| 6,140,144 A | * | 10/2000 | Najafi et al. | 438/53 |
| 6,316,840 B1 | * | 11/2001 | Otani | 257/787 |
| 6,376,907 B1 | * | 4/2002 | Takano et al. | 257/704 |
| 6,475,830 B1 | * | 11/2002 | Brillhart | 438/109 |
| 6,574,860 B1 | * | 6/2003 | Giussani et al. | 29/840 |
| 2002/0025608 A1 | * | 2/2002 | Shinonaga et al. | 438/127 |
| 2002/0074669 A1 | * | 6/2002 | Watanabe et al. | 257/777 |

* cited by examiner

Primary Examiner—Michael Lebentritt
Assistant Examiner—Angel Roman
(74) Attorney, Agent, or Firm—Vedder, Price, Kaufman & Kammholz, P.C.

(57) ABSTRACT

A multi-die module is electrically connected to both an unpackaged die and a packaged die as disclosed herein. The multi-die module has a footprint that is the same as conventional multi-die packages, which do not include packaged die, thereby allowing the multi-die module to be interchangeable with conventional multi-die packages. In one embodiment, the unpackaged die is a graphics processor, and the packaged die is a standard memory that has been burned in, functionally tested, and speed rated.

16 Claims, 5 Drawing Sheets

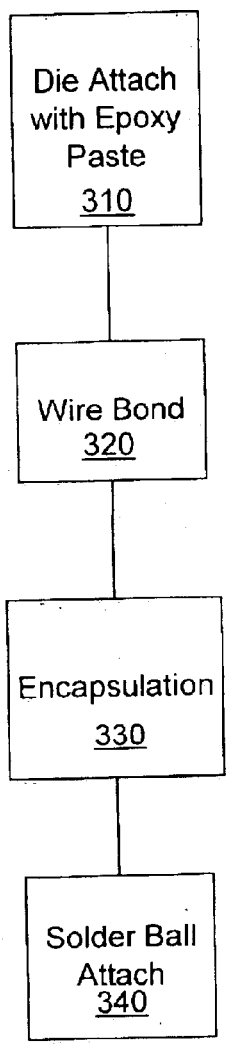
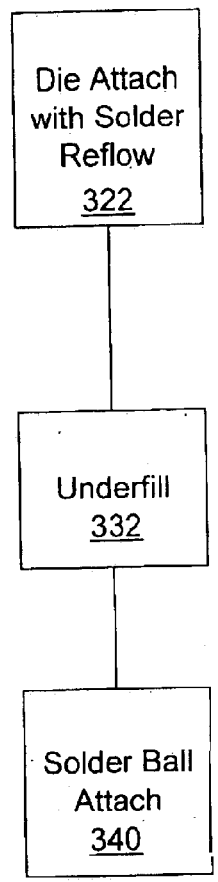
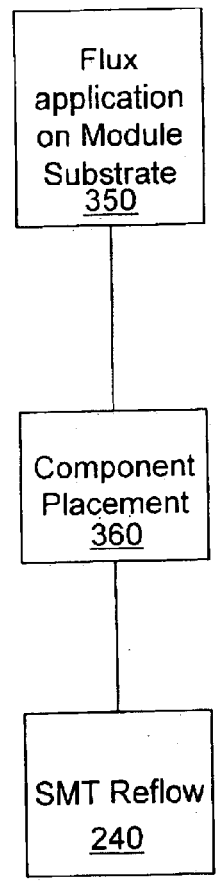
FIG. 11
FIG. 12
FIG. 13

MULTI-DIE MODULE AND METHOD THEREOF

This is a divisional application of co-pending application Ser. No. 09/886,741, filed Jun. 21, 2001, entitled "Multi-Die Module and Method Thereof", having as inventors Vincent Chan and Samuel Ho, and owned by instant assignee.

FIELD OF THE DISCLOSURE

This application relates generally to semiconductor packaging, and more particularly to multiple die packages.

BACKGROUND

Various manufacturing and performance considerations often make it desirable to include more than one semiconductor die in a single package. However, by including more than one die in a single package, various testing problems arise. For example, since it is relatively expensive to test semiconductor die separately before they are packaged, manufacturers sometimes perform a minimal amount of testing on individual die before those die are placed into a multi-die package. Because the individual die are not tested before they are packaged, the die must be tested together after packaging. While testing the die together after packaging is usually less expensive than testing each die separately before packaging, when one of the die in the multi-die package is defective, the whole multi-die package must usually be scrapped, resulting in the loss of other good die in that package.

Another limitation of testing multiple die in a single package is that the more die within a single package, the more complex the testing becomes. This added complexity requires more complex test hardware, and can limit the ability to thorough-test some portions of one or more die within the multi-die package. It would be useful, therefore, to know that each die used in multi-die packages was fully functional, without having to rely on expensive pre-package die testing.

BRIEF DESCRIPTION OF THE DRAWINGS

FIGS. 10–13 are flow diagrams illustrating steps of various methods according to the present disclosure.

Figure 1:
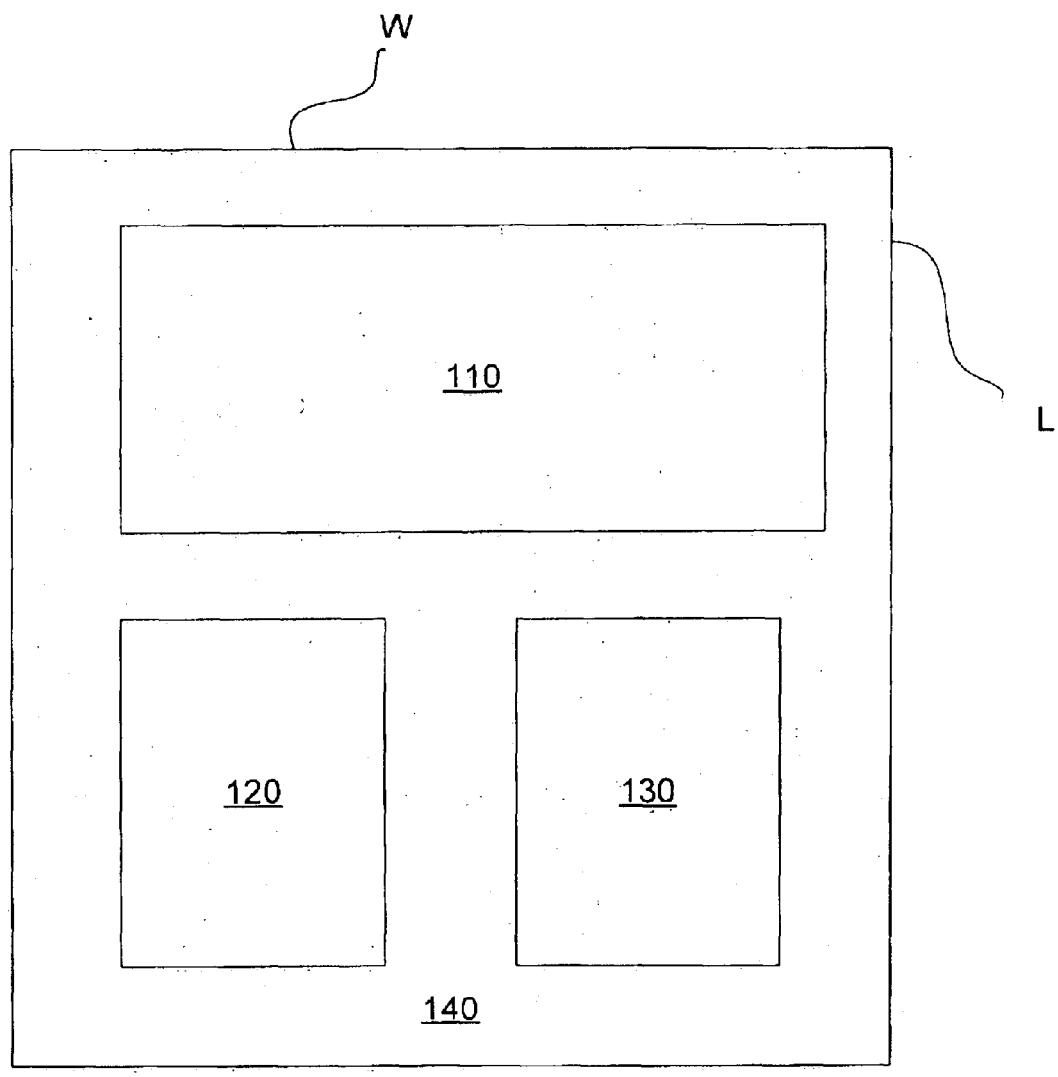
FIG. 1 is a diagram in planar view of a multi-die module according to one embodiment of the present disclosure.

It will be appreciated that for simplicity and clarity of illustration, elements illustrated in the Figures have not necessarily been drawn to scale. For example, the dimensions of some of the elements are exaggerated relative to other elements for clarity. Further, where considered appropriate, reference numerals have been repeated among the Figures to indicate corresponding or analogous elements.

DETAILED DESCRIPTION OF THE FIGURES

In accordance with a specific embodiment of the present disclosure, a device including a multi-die module having a footprint size consistent with the footprint size of a standard package including only direct-attached semiconductor die is disclosed. The device includes both an unpackaged semiconductor die electrically connected to the multi-die module, and a packaged semiconductor die electrically connected to the multi-die module. In at least one embodiment, the unpackaged die is a graphics processor, and the packaged die is a memory die that has been previously burned in, functionally tested and speed rated. This multi-die module is advantageous over prior multi-die packages because by using tested and packaged devices, the problem of scrapping an entire multi-die package for a single bad die can be reduced. Various embodiments are described in greater detail with reference to FIGS. 1–9.

Referring first to FIG. 1, a completed module for holding multiple semiconductor die is illustrated, and referred to generally as package module 100. Length dimension L and width dimension W are chosen so that package module 100 has a footprint that corresponds closely to the footprint of standard/conventional packages that are manufactured using one or more direct-attach (non-packaged) die. In addition, at least one embodiment of package module 100 is configured to have a ball grid array having a number and pitch of ball grid connections equivalent to standard packages. The term "standard packages" refers to those packages in common use, those packages identified and/or described by industry standards groups such as the Joint Electron Device Engineering Council (JEDEC), and/or those packages used on at least a semi-regular basis by industry participants. One example of a standard package is a 31×31 millimeter plastic ball grid array (PBGA). By using package sizes having standard footprints and/or array configurations, package module 100 can be used interchangeably in many circumstances with other packages, and is compatible with common handling equipment and manufacturing processes. In various embodiments, even though the footprint of package module 100 does not correspond exactly with a standard package size, it is consistent with conventional single and/or multi-die packages performing the same functions. Some examples of standard multi-die packages include ball grid array (BGA) packages having footprint sizes of 35 mm×35 mm, 31 mm×31 mm, 27 mm×27 mm, 37.5 mm×37.5 mm, 40 mm×40 mm, 42 mm×42 mm, and 42.5 mm×42.5 mm. It will be appreciated that package module 100 may have various combinations of length dimension L and width dimension W depending upon which the desired system in which package module 100 will be used.

It will be appreciated that often multiple direct-attach die are mounted on a standard package substrate which is used in other cases for only a single die. As used above and in the following disclosure and claims, the terms multi-die module or multi-die module substrate include in their meanings not only multi-die packages and substrates used exclusively for mounting more than one semiconductor die, but also substrates that are capable of being used to mount both single and multiple semiconductor die.

In the embodiment illustrated, package module 100 has unpackaged die 110 mounted on it, as well as packaged die 120 and 130. In at least one embodiment, unpackaged die 110 is a data processor, such as a general purpose processor or a graphics processor, and packaged die 120 and 130 are memory packaged in chip Scale Packages (CSP) or stacked CSP memories. In other embodiments, unpackaged die 110 may be an additional processor such as an audio processor, a general purpose processor, a controller, etc., while packaged die 120 and 130 may be static random access memories (SRAM), dynamic random access memories (DRAM), read only memories (ROM), flash memories, electrically erasable programmable memories (EEPROMS), or any other suitable memory type of combination of types. In addition, packaged die 120 and 130 may be processors of the same or a different type than unpackaged die 110. Various embodiments of the present invention may employ different combinations of unpackaged semiconductor die 110 and packaged semiconductor die 120 and 130, including the use of two unpackaged semiconductor die 110 and only one packaged semiconductor die 120, or multiple packaged semiconductor die 120 and 130 with no unpackaged semiconductor die 110.

Figure 2:
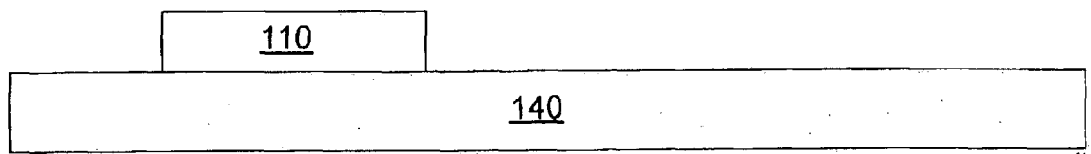
FIGS. 2–9 illustrate, in cross-sectional view, steps associated with the method of forming a package in accordance with a specific embodiment of the present disclosure.

FIG. 2 illustrates a partially completed multi-die module. Multi-die module substrate 140 is shown with unpackaged semiconductor die 110 attached in preparation for wire bonding. In one embodiment, multi-die module substrate 140 is a built up substrate having four to six layers. In another embodiment, multi-die module substrate 140 is a Bizmalemide Triazine (BT) substrate having two to six layers. It will be appreciated that any suitable substrate may be employed according to the teachings set forth herein.

Figure 3:
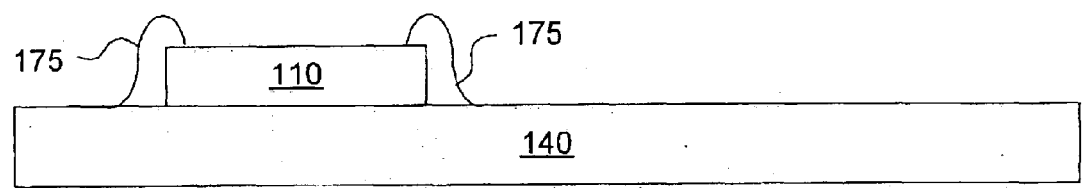

FIG. 3 illustrates the partially completed multi-die module of FIG. 2, but now bond wires 175 have been added to make an electrical connection between multi-die module substrate 140 and unpackaged semiconductor die 110. In at least one embodiment, bond wires 175 are made of a corrosion resistant material, such as gold, to resist corrosion, but other suitable wire types or similar means of electrical connection may be employed as desired.

Figure 4:
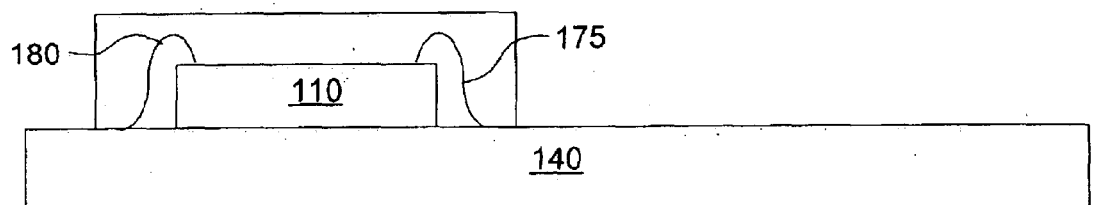

FIG. 4 illustrates the partially completed multi-die module of FIG. 3, after unpackaged semiconductor die 110 has been encapsulated with encapsulation material 180. Some examples of encapsulation material 180 are epoxy, metal cap or silicon coatings. Encapsulation material 180 may be dry molded or liquid molded depending on the type of encapsulation material desired. At this stages solder balls 160 may be added to the bottom of multi-die module substrate 140 to provide for future connection of the completed package module 100 (FIG. 1) to a circuit board and/or other system. In order to facilitate interchangeability with many standard packages, solder balls 160 may have a pitch of 1.27 millimeters, 1.0 millimeters, 0.80 millimeters, 0.75 millimeters, or any other pitch suitable for a desired application. It will be appreciated that solder balls may be added at other suitable times during the manufacturing process.

Figure 5:
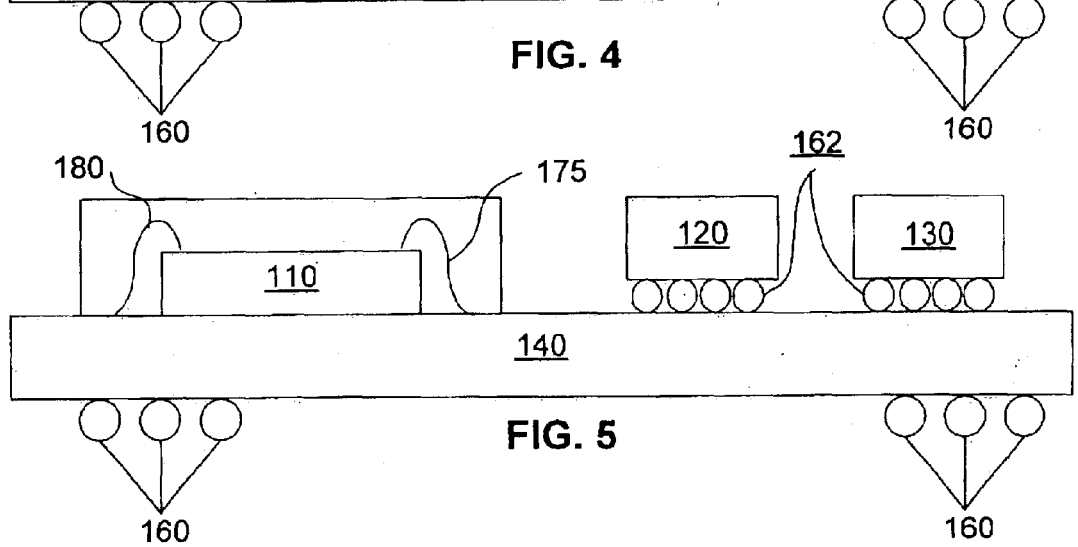

FIG. 5 shows packaged die 120 and 130 being attached to multi-die module substrate 140. In at least one embodiment, packaged die 120 and 130 are CSP memories or other packaged die manufactured for use with flip-chip or surface mount technology (SMT) reflow. In at least one embodiment, solder pads 162 have a pitch of 0.8 millimeters, but other suitable pitches, including 1 millimeter, 0.75 millimeters, etc. may be employed. By using package types suitable for use with SMT reflow, attachment and electrical connection are accomplished in a single step. If package types other than flip-chip type packages are used, other methods of attachment, such as those used in attaching unpackaged semiconductor die 10, may be employed as necessary. At this point, the manufacture of package module 100 (FIG. 1) may be complete.

Figure 6:
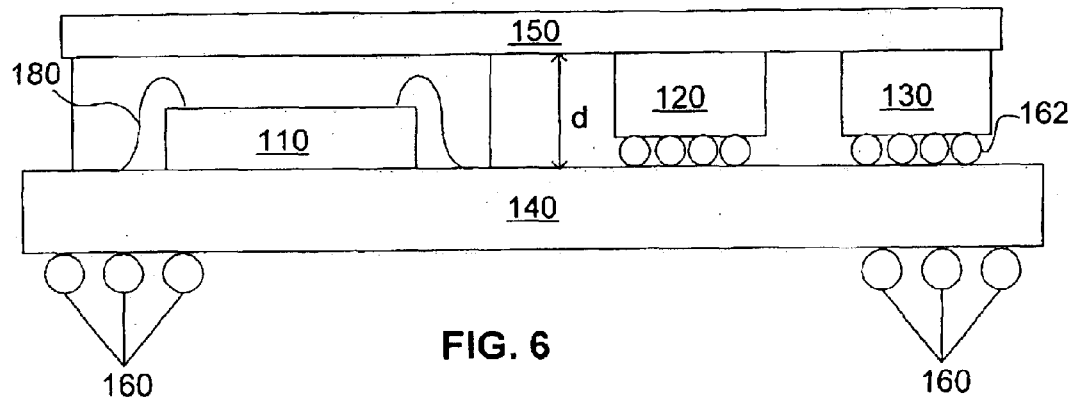

FIG. 6 illustrates a heat sink 150 added on top of unpackaged semiconductor die 110 and packaged die 120 and 130 to aid in removing heat from the circuits. As illustrated, the distance "d" from the top of multi-die module substrate 140 to the top of packaged die 120 and 130 is substantially equal to the distance from the top of multi-die module substrate 140 to the top of the encapsulation material over unpackaged semiconductor die 110, which is referred to herein as the top of unpackaged semiconductor die 110. In at least one embodiment, distance "d" is about 1.3 millimeters. Making these distances the same facilitates effective use of heat sink 150, although heat sink 150 could be fabricated to account for any difference between the heights of various packaged and/or unpackaged die attached or mounted to multi-die module substrate 140. In various embodiments, heat sink 150 may be a thin strip of heat conductive material, a large heat sink with fins for added heat dissipation, or any other suitable type of heat sink.

Figure 7:
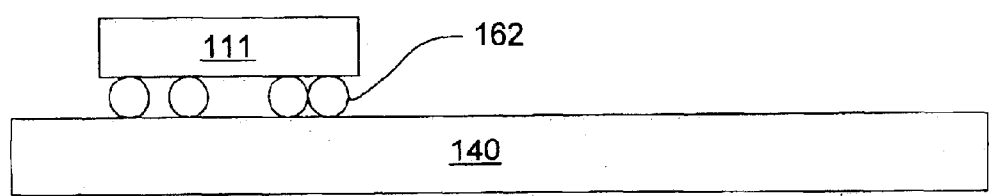

FIG. 7 illustrates an alternate method of attaching unpackaged semiconductor die 111 to multi-die module substrate 140. Unpackaged semiconductor die 111 illustrated in FIG. 7 differs from unpackaged semiconductor die 110 (FIGS. 2–6) only in that unpackaged semiconductor die 111 is manufactured for use with flip-chip technology instead of wire-bond technology. Consequently, unpackaged semiconductor die 111 includes solder pads 162, which as previously discussed, serve to both a physically attach and electrically connect unpackaged semiconductor die 111 to multi-die module 140.

Figure 8:
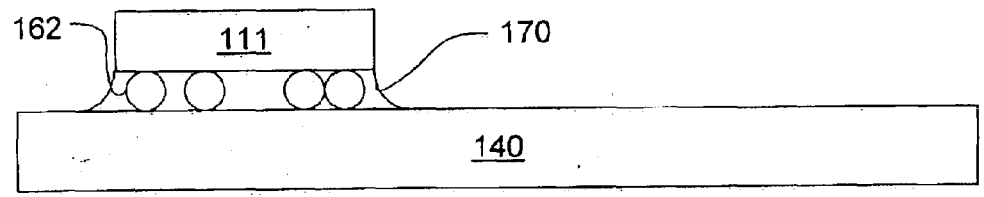

FIG. 8 illustrates another method of insulating electrical connections between unpackaged semiconductor die 111 and multi-die module substrate 140. Since all of the electrical connections are underneath unpackaged semiconductor die 111, there is no need for total encapsulation of unpackaged semiconductor die 111 to protect the electrical connections. Consequently, unpackaged semiconductor die 111 is underfilled with underfill material 170. Underfill material 170 may include, but is not limited to, ASEUA03 and ASEUA04 types of underfill materials.

Figure 9:
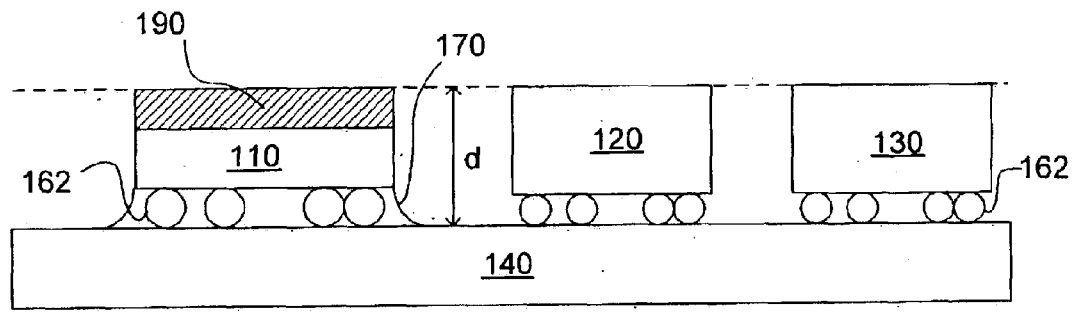

FIG. 9 shows packaged die 120 and 130 attached as already discussed. Note however, that the top of unpackaged semiconductor die 111 is not level with the tops of packaged die 120 and 130. Therefore, shim 190 is used to effectively raise the top of unpackaged die 111 to be even with the tops of packaged die 120 and 130, and thereby facilitate the use of a heat sink (not shown). Shim 190 may be composed of silicon, or another suitable heat conveying material. It will be appreciated that a shim such as shim 190 may be used on top of packaged die 120 and/or 130, instead of or in addition being used on top of unpackaged die 111 if needed.

Figure 10:
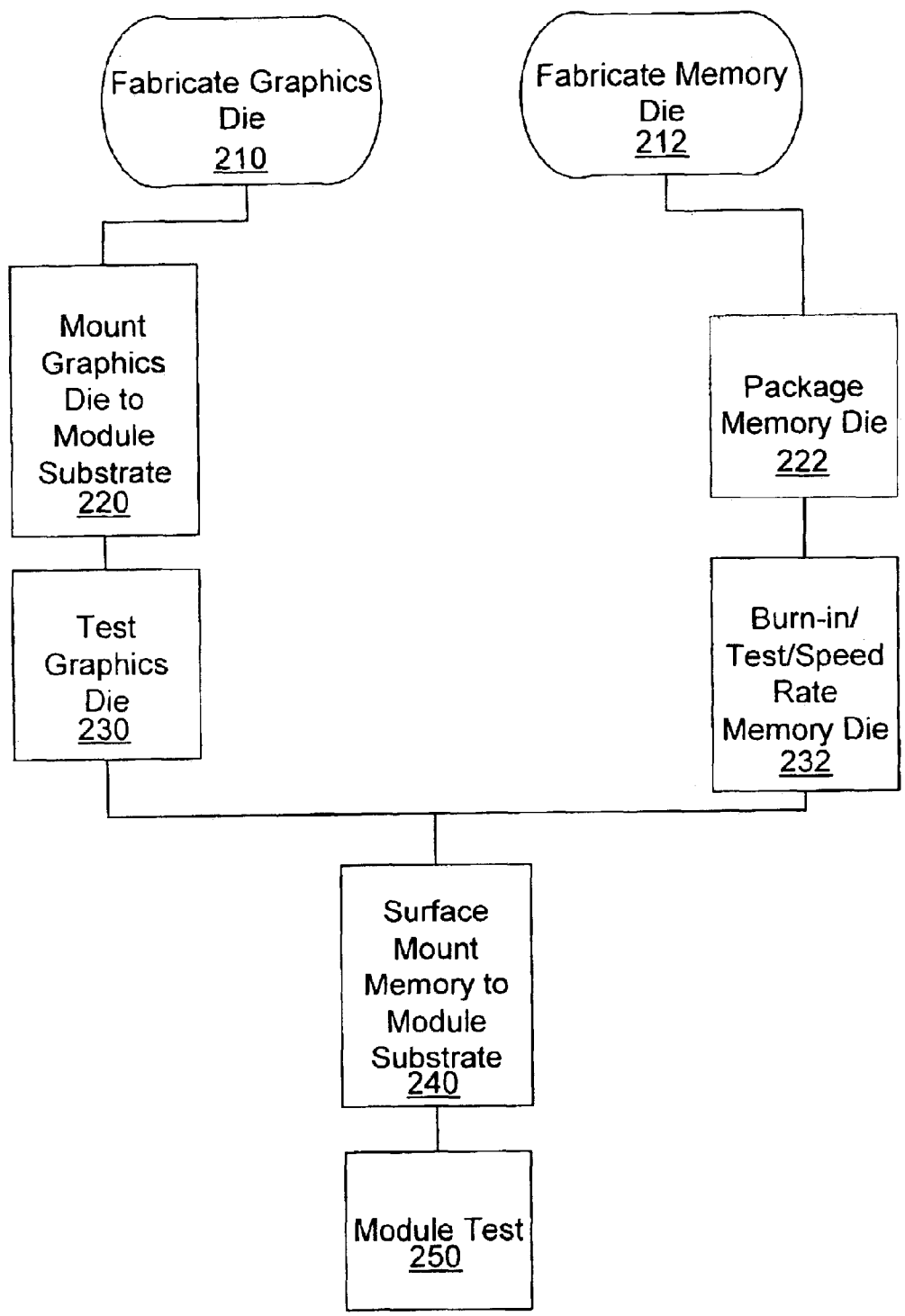

FIG. 10 is a flowchart illustrating a method according to one embodiment of the present disclosure. It will be appreciated that some of the steps illustrated may be performed concurrently, or in a different order than illustrated without departing from the spirit and scope of the teachings set forth herein. In step 210, what will be the direct-attach/unpackaged die is fabricated, and prepared for use. In the embodiment illustrated, this die is a graphics chip die. The graphics die is then mounted to a multi-die module substrate using flip-chip, wire-bond, or another suitable process during step 220. It is also during this step that electrical connections are made, the die is encapsulated or underfilled, and solder balls are attached to the bottom of the multi-die module substrate to facilitate testing of the graphics die. The method then proceeds to step 230, in which the graphics die is tested. Note that by testing the graphics die at this point, a test fixture for use with packaged die can be used. Also, if the graphics die is bad, then no other die are lost. It will be noted that in at least one embodiment, all connections required for testing of the graphics die are connected to pins on the package.

In one embodiment, at the same time steps 210–230 are being performed, steps 212–232 are also being performed. What will become a packaged die, in this illustration a memory die, is fabricated in step 212. The memory die is then packaged in step 222. It will be appreciated that various wire-bond or flip-chip mounting methods similar to those discussed earlier may be used to package the memory die. Once the memory die is packaged in step 222, the packaged memory die is burned in, tested and speed rated in step 232.

By the time step 240 is started, there is a known good graphics die on the multi-die module substrate, and a known good packaged memory die. The packaged memory die is then surface mounted to the multi-die module substrate in step 240, and the entire multi-die memory module is tested in step 250.

Referring now to FIGS. 10 and 11, step 220 of FIG. 10 will be discussed in greater detail for the case in which the graphics die is to be electrically connected to the multi-die module substrate using wire-bonding techniques. First, the die is secured to the multi-die substrate using an adhesive, for example epoxy paste in step 310. The epoxy paste can be either an electrically conductive adhesive, such as AbleStik 8355F, or a non-conductive adhesive, such as QMI536. Then in step 320, wires are connected between the graphics die and the multi-die module substrate using standard wire bonding techniques. Once the graphics die has been physically attached and electrically connected to the multi-die module substrate, the graphics die and the wires connecting the die to the substrate are encapsulated in step 330. As noted earlier, encapsulation may include a dry encapsulation process, a liquid encapsulation process, or other suitable encapsulation process. After the graphics die is encapsulated, solder balls are formed on the bottom of the substrate to aid in testing the graphics die, and for later connection to a printed circuit board or other system component. It will be appreciated that if it is desired to use connection means other than SMT reflow to connect the completed multi-die module to an external system, then other commonly known connections can be formed on the multi-die module, and the solder balls may be attached to the multi-die module substrate at a different point in the manufacturing process if desired.

Referring now to FIGS. 10 and 12, step 220 of FIG. 10 will be discussed in greater detail for the case in which the graphics die is to be electrically connected to the multi-die module substrate using flip-chip techniques. In step 322, the graphics die is attached using a solder reflow technique such as is commonly used in flip-chip or SMT applications. Using a reflow technique provides both physical attachment and electrical connection. Next, step 332 is performed, in which the area under the graphics die and between the electrical connections is underfilled. At this point, step 340 is performed to form solder balls on the under-side of the multi-die module.

Lastly, referring to FIGS. 10 and 13, step 240 of FIG. 10 is more fully discussed. The steps of FIG. 13 are performed after the graphics die has already been installed into the multi-die module, and tested. These steps are used to perform the connection of packaged die such as CSP memories onto to the multi-die module substrate. In step 350, flux or solder paste is applied to the portion of the multi-die module substrate on which the packaged memory die is to be mounted to facilitate solder melting at lower temperatures and the formation of strong, reliable solderjoints. In the next step, step 360, the packaged memory die is placed onto the multi-die module substrate in preparation for SMT reflow in step 240. In at least one embodiment, SMT reflow is performed at a maximum of 225° degrees centigrade to prevent damage to other components and/or connections due to excessive heat. The maximum temperature may change if the material used for the solderballs changes. For example, a maximum temperature of about 260 degrees Centigrade may be required if lead free solder is used.

In the preceding detailed description, FIGS. 1–13 have been used to teach a multi-die module that is electrically connected to both an unpackaged die, such as a graphics processor and a packaged die, such as a CSP memory. The multi-die module has a footprint that is the substantially the same as conventional multi-die packages, which do not include packaged die, thereby allowing the multi-die module to be interchangeable with conventional multi-die packages. A multi-die module as disclosed herein has the advantage of decreasing the likelihood that good die in a multi-die configuration will have to be scrapped. A multi-die module constructed according to the teachings set forth herein has the further advantage of facilitating thorough testing without the added costs imposed by equipment needed to test individual die outside of a package. Various techniques for making physical and electrical connections between the die and the multi-die module have been discussed with sufficient specificity to allow one skilled in the art to practice the teachings set forth herein without undue experimentation.

Accordingly, the specification and figures herein are to be regarded in an illustrative rather than in a restrictive sense, and all such modifications and their equivalents are intended to be included within the scope of the present invention. Benefits, other advantages, and solutions to problems have been described above with regard to specific embodiments. However, the benefits, advantages, solutions to problems, and any elements that may cause any benefit, advantage, or solution to occur or become more pronounced are not to be construed as critical, required, or essential features or elements of any or all of the claims.

What is claimed is:

1. A method comprising the steps of:
   directly attaching a first semiconductor die to a package substrate;
   forming electrical connections between the first semiconductor die and the package substrate;
   encapsulating the first semiconductor die in a structure having a planar top surface;
   placing a second semiconductor die having a top surface in a die package;
   attaching the die package to the package substrate; and
   forming electrical connections between the die package and the package substrate;
   wherein the encapsulated top surface and a die package top surface are of equal distance from the package substrate.

2. The method as in claim 1, wherein the step of placing the second semiconductor die in a die package includes placing the semiconductor die in a ball grid array package.

3. The method as in claim 1, wherein the steps of directly attaching and forming electrical connections are performed using a flip-chip process.

4. The method as in claim 1, wherein the steps of attaching and forming electrical connections are performed using surface mount technology reflow.

5. The method as in claim 1, wherein the step of directly attaching includes the use of adhesives.

6. The method as in claim 1, wherein the steps of forming electrical connections include wire-bonding.

7. The method as in claim 1, wherein securing the electrical connections includes encapsulating the first semiconductor die.

8. The method as in claim 1, wherein securing the electrical connections includes underfilling the first semiconductor die.

9. The method as in claim 1, further including the step of attaching solder balls to an underside of the package substrate.

10. The method as in claim 1, wherein the package substrate has a footprint of one of 35 mm×35 mm, 31 mm×31 mm, 27 mm×27 mm, 37.5 mm×37.5 mm, 40 mm×40 mm, 42 mm×42 mm, or 42.5 mm×42.5 mm.

11. The method as in claim 1, further including the step of attaching a heat sink to the package substrate.

12. The method as in claim 11, further including the step of positioning a shim on top of the first semiconductor die such that a top of the shim and a top surface of the die package are of substantially equal distance from a surface of the package substrate.

13. The method as in claim 1, further including the step of testing the first semiconductor die prior to the step of attaching the die package to the package substrate.

14. The method as in claim 1, further including the step of testing the second semiconductor die after the step of placing the second semiconductor die in a die package and prior to the step of attaching the die package.

15. A method of forming a multi-die module, comprising:

mounting a first semiconductor die to a module substrate;

forming an electrical connection between the first semiconductor die and the module substrate;

encapsulating the first semiconductor die in a rectangular structure;

placing a second semiconductor die in a corresponding die package;

mounting the die package to the module substrate; and forming an electrical connection between the die package and the module substrate;

wherein the encapsulation structure top and a top surface of the die package are of equal distance from a surface of the module substrate.

16. The method as in claim 15, further including attaching a heat sink to the module substrate.

* * * * *